United States Patent [19]

Hales

[11] Patent Number: 5,041,779
[45] Date of Patent: Aug. 20, 1991

[54] NONINTRUSIVE ELECTRO-OPTIC FIELD SENSOR

[75] Inventor: Walter L. Hales, Huntsville, Ala.

[73] Assignee: The United States of America as represented by the Secretary of the Army, Washington, D.C.

[21] Appl. No.: 570,926

[22] Filed: Aug. 17, 1990

[51] Int. Cl.$^5$ .......................... G01R 31/00; H01S 3/10
[52] U.S. Cl. .................................. 324/96; 324/158 R; 356/352
[58] Field of Search .............. 324/158 R, 158 D, 73.1, 324/71.3, 96, 77 K; 250/310, 311, 231.1; 356/352; 350/374, 352, 375, 351, 376, 377–378

[56] References Cited

U.S. PATENT DOCUMENTS

| 4,196,396 | 4/1980 | Smith | 356/352 |
|---|---|---|---|
| 4,221,472 | 9/1980 | Smith et al. | 356/352 |
| 4,910,454 | 3/1990 | Williamson | 324/77 K |

FOREIGN PATENT DOCUMENTS 0357475  3/1990  European Pat. Off. ............ 356/352

OTHER PUBLICATIONS

Valkenburg et al., "A High Q Fabry Perot Interferometer for Water Vapor Absorption Measurments in the 100 Gc/S to 300 Gc/S Frequency Range".

Primary Examiner—Kenneth A. Wieder
Assistant Examiner—Vinh P. Nguyen
Attorney, Agent, or Firm—Freddie M. Bush; Hay Kyung Chang

[57] ABSTRACT

Utilizing the property of electro-optic crystal which changes its index of refraction in the presence of electric field, such a crystal is placed inside the resonant cavity of a Fabry-Perot type interferometer. Laser light travelling through the cavity and the crystal experiences modified optical path length in the presence of electric field. The fringe pattern at the focal plane is observed and used to detect and measure the ambient electric field.

2 Claims, 1 Drawing Sheet

NONINTRUSIVE ELECTRO-OPTIC FIELD SENSOR

The invention described herein may be manufactured, used, and licensed by or for the Government for governmental purposes without the payment to me of any royalties thereon.

BACKGROUND OF THE INVENTION

Most interferometric electric field sensors use a two-beam interferometer such as a Mach Zehnder or Michelson interferometer which give low-contrast, broad and diffuse interference fringes which are difficult to measure with high precision. Another type of interferometer used in electric field sensors is the Fabry-Perot interferometer which is a resonant cavity bounded by two end mirrors separated so as to produce interference for certain allowed optical frequencies. However, the multiple beam Fabry-Perot type interference filters have conductive coatings on electro-optic bare crystals, and usually have antennas attached to the crystals in order to detect the electric field. These coatings and antennas distort the very electric field one is attempting to measure and result in biasing the measurements. Field sensors that have bare crystals utilize the property of the crystals which changes the polarization of the light that goes through them in the presence of electric field. But these sensors lack interferometric sensitivity. The interferometric sensors frequently are of the two-beam interference type with the attendant inability to give sharp, distinct fringes.

SUMMARY OF THE INVENTION

An electro-optic crystal is used in conjunction with a completely dielectric Fabry-Perot type interferometer to detect and measure extremely small ambient electric fields.

DESCRIPTION OF THE PREFERRED EMBODIMENT

Figure 1:
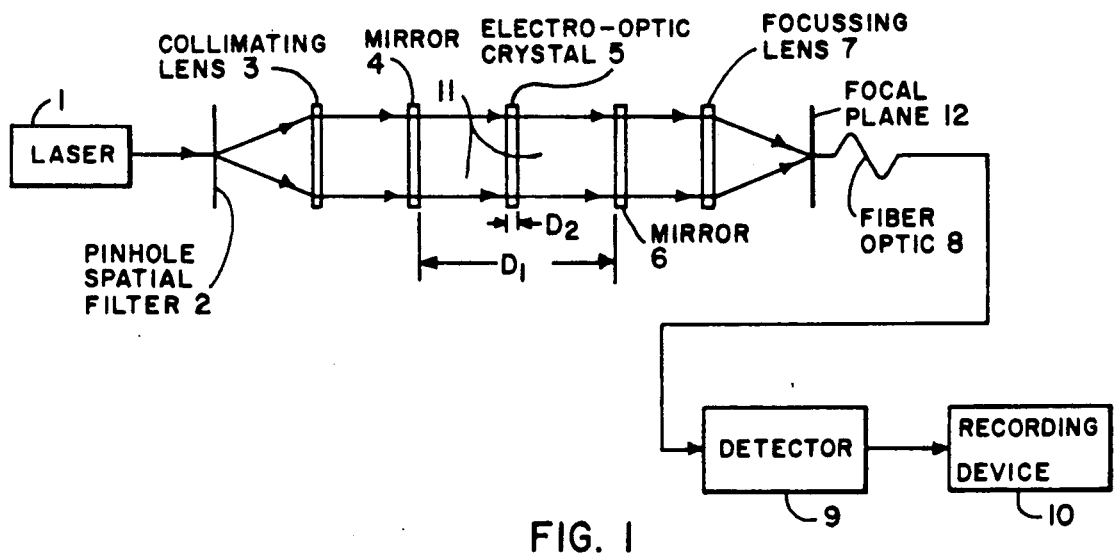
FIG. 1 is a block diagram of the preferred embodiment of the nonintrusive electro-optic field sensor.
Figure 2:
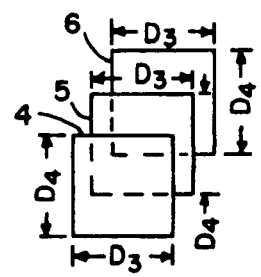
FIG. 2 shows the relative dimensions of the mirrors and the electro-optic crystal.

The heart of the invention lies in the placement in resonant cavity 11 which is formed by two partially reflective mirrors 4 and 6 separated by distance $D_1$ electro-optic crystal 5 that is of such dimensions as to oblige all light travelling inside cavity 11 to pass through the crystal. In other words, crystal 5 is as wide and high as mirrors 4 and 6, as indicated by $D_3$ and $D_4$, respectively, and plane parallel with the mirrors as shown in FIG. 2. Therefore, no light travelling inside cavity 11 can travel around crystal 5. Crystal 5 is held in place by plastic supports or any other suitable electrically non-conductive item. Laser source 1, operating in the transverse electric mode ($TEM_{oo}$ mode), produces laser light whose optical path is indicated in FIG. 1 by arrows. The light impinges on pinhole spatial filter 2 which diverges the light to illuminate fully collimating lens 3. Lens 3 is free of spherical aberration and is suitable for infinity focussing. The beam is collimated by collimating lens 3 and therefrom impinges on first partially reflective mirror 4 having dielectric reflective coating thereon. A portion of the light impinging on the mirror is transmitted while the remainder is reflected. The transmitted portion travels through the cavity and electro-optic crystal 5 until it reaches second partially reflective mirror 6 also having thereon dielectric reflective coating. Part of the light reaching mirror 6 is transmitted out toward focussing lens 7 while the remainder is reflected through crystal 5 back to mirror 4. From mirror 4, the reflected light travels again through cavity 11 and crystal 5 and reaches mirror 6 which transmits out another fraction and reflects the remainder to the first mirror. This process is repeated many times. As the ambient electric field changes, the refractive index of electro-optic crystal 5 changes, thereby changing the optical path length between the two mirrors 4 and 6. Thus as laser light oscillates inside cavity 11, the different portions of light will have travelled different optical path lengths by the time they are transmitted out of second mirror 6. For example, the portion of light that passes through crystal 5 the least number of times will have the effect of having traveled the shortest optical path length while the portion that passes through the crystal the most number of times will have the effect of having traveled the longest optical path length. When all the different portions of light that are transmitted out of mirror 6 at different time are focussed by lens 7 at focal plane 12, the emerging pattern is a bullseye with circular fringes. The modification of optical path length caused by the ambient electric field changes the order of interference at the focal plane. The order of interference is given by the equation, $$m = \frac{2[D_1 + (n-1)D_2]}{\lambda}$$

where $D_1$ = the distance between mirrors 4 and 6
  $D_2$ = physical thickness of electro-optic crystal 5
  n = index of refraction of electro-optic crystal 5
and $\lambda$ = wavelength of the laser light. All distances and $\lambda$ are measured in the same unit.

For an electro-optic crystal whose nominal index of refraction is approximately 1.5 and whose thickness is 1.0 cm, if mirrors 4 and 6 are placed in contact with the crystal, two consecutive maxima in the fringe pattern at the focal plane represent a change of less than 0.002% in the refractive index of the crystal. In practice, however, a thin crystal would be used. If the thickness of the crystal is no more than 0.25 cm, it can respond to electric field changes of the order of 20 GHZ.

The bullseye interference pattern at focal plane 12 is transmitted via optical fiber 8 to detector 9. Detector 9 can be a camera, but would usually be an electro-optic detector which generates electrical signal proportional to the intensity of the light input thereto. The signals are then input via ordinary electrical connections to suitable recording device 10 such as a PC computer, depending on the requirements of the user. From the recording device, the fringes can be measured and, using the equation given above, the effective index of refraction of crystal 5 can be calculated. Thus, changes in the ambient electric field is detected and measured from changes detected in the index of refraction of crystal 5. Although the relationship between the electric field intensity and the index of refraction of crystal 5 could be determined theoretically, it should always be determined empirically to avoid unanticipated systematic errors.

If the change in the magnitude of the electric field is very small, a single electro-optic detector 9 will suffice. If the change in the electric field is sufficient to produce a change of more than one fringe at focal plane 12, optical fiber 8 and detector 9 should be replaced with two optical fibers and two detectors. If several fringes are counted as they traverse detector 9, and then the direction of fringe motion reverses, the count must subtract rather than add. This problem may be solved by the use of two electro-optic detectors placed at a 90 degree phase relationship (quadrature) with the fringe pattern. In this case, the two detectors' outputs are compared for lead or lag relationship and the count progresses up or down accordingly. If detector 9 is a camera, the direction of the fringe motion in the bullseye pattern is observed easily.

The use of optical fiber is mandated by the requirement to remove all electrically conductive items from the presence of ambient electric fields. Ambient electric fields, the very subject under detection and measurement, may be distorted by electrically conductive parts of the detector and the recording device. Optical fiber allows detector 9, recording device 10 and electrical cables between them to be located in another room or otherwise far away where they will not cause distortion in the ambient electric field and enable accurate measurement of the field.

Although a particular embodiment and form of this invention has been illustrated, it is apparent that various modifications and embodiments of the invention can be made by those skilled in the art without departing from the scope and spirit of the foregoing disclosure. For instance, the sharpness or finesse of the fringes at the focal plane and the free spectral range of the interferometer can be controlled by varying $D_1$ between mirrors 4 and 6. As $D_1$ increases, the fringe sharpness or resolution increases while the free spectral range decreases. The physical thickness of crystal 5 may also be varied to control the sensitivity of the sensor. Accordingly, the scope of the invention should be limited only by the claims appended hereto.

I claim:

1. A completely dielectric electro-optic field sensor for detecting ambient electric field, comprising:

A means for generating and directing a laser beam, a first and a second partially reflective mirrors positioned linearly in the path of the beam to partially reflect and partially transmit the beam therethrough, said mirrors being separated by a distance to crate a resonant cavity therebetween, an electro-optic crystal placed within said cavity, a means for receiving the transmitted beam from said second mirror and focusing the transmitted beam at a focal plane to create an interference pattern having fringes, and a means for measuring the fringes of said pattern and calculating therefrom the effective index of refraction of said crystal, said refractive index being variable according to the magnitude of the ambient electric field.

2. An electric field sensor as set forth in claim 1, wherein said electro-optic crystal is as wide and high as said mirrors and plane-parallel with said mirrors so that no portion of the beam is allowed to travel around said crystal inside said resonant cavity.

* * * * *